United States Patent [19]

Riley

[11] 4,401,053

[45] Aug. 30, 1983

[54] COATING FIXTURE

[76] Inventor: Thomas J. Riley, 905 Richmar Dr., Westlake, Ohio 44145

[21] Appl. No.: 284,393

[22] Filed: Jul. 17, 1981

[51] Int. Cl.³ .............................................. B05C 11/16
[52] U.S. Cl. .................................... 118/721; 118/500; 118/504; 118/505
[58] Field of Search ............... 118/500, 504, 505, 721, 118/720

[56] References Cited

U.S. PATENT DOCUMENTS 2,786,444 3/1957 Marrs .............................. 118/503 X
3,185,471 5/1965 Coll-Palagos ................... 118/505 X
3,895,135 7/1975 Hofer .............................. 427/255.6
4,041,896 8/1977 Koo et al. ....................... 118/504 X Primary Examiner—Shrive P. Beck
Attorney, Agent, or Firm—Watts, Hoffmann, Fisher & Heinke

[57] ABSTRACT

A coating fixture for holding and masking workpieces during a parylene batch coating process. A rigid frame and two face plates form an enclosure. The face plates have a plurality of holes, and the workpieces are located within the enclosure, so that they are aligned with the holes. In preferred embodiments, a separator plate located within the enclosure divides it into two article-receiving compartments, and gaskets are provided for sealably engaging the face plates to the frame and to the workpieces in each compartment. Vaporous coating material enters the face plate holes and coats only portions of the workpieces.

10 Claims, 4 Drawing Figures

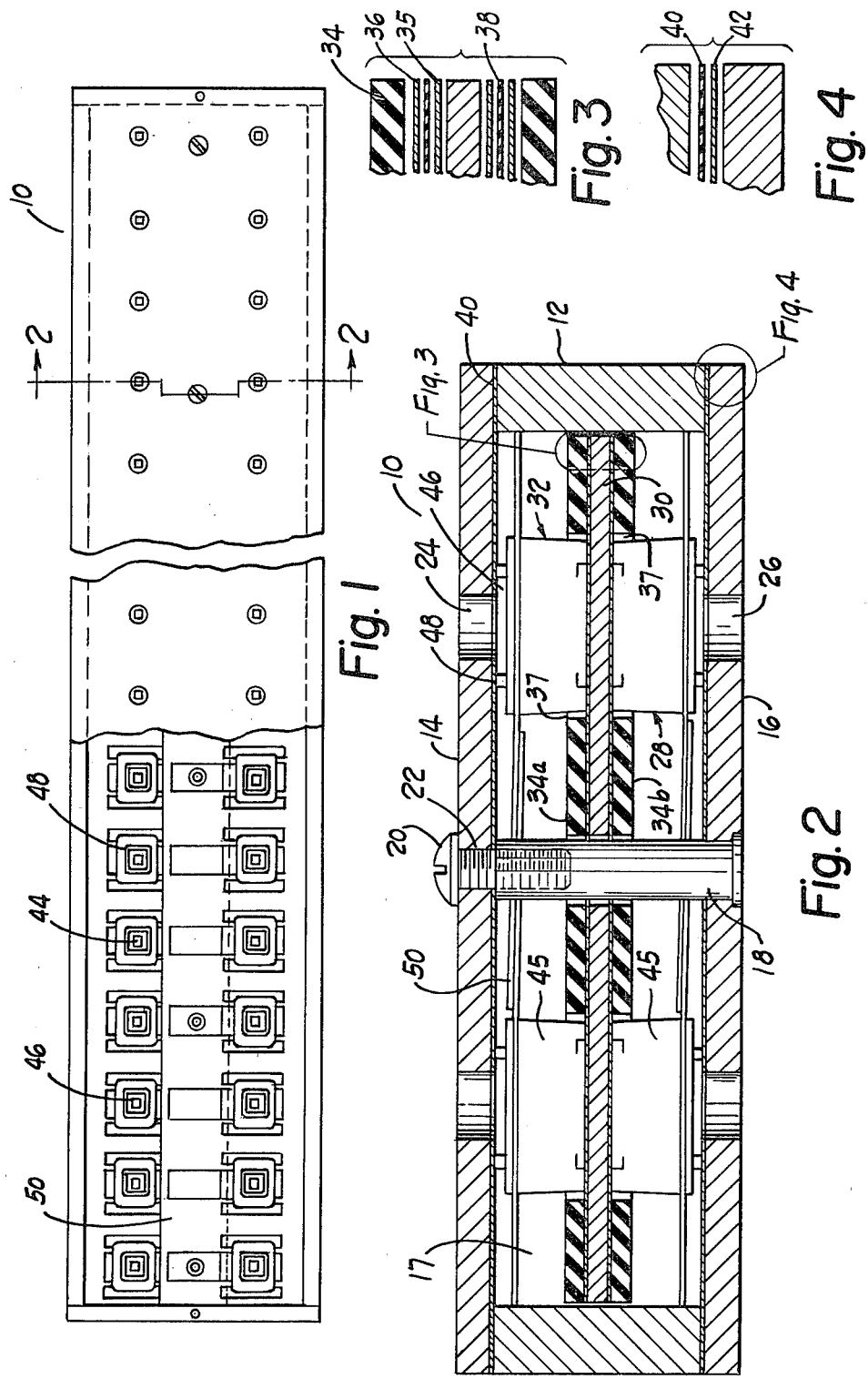

COATING FIXTURE

DESCRIPTION

1. Technical Field

The present invention relates to the coating of workpieces, and is particularly directed to a fixture for holding and masking multiple workpieces so that they can be coated with parylene or the like in a batch process.

2. Background Art

Various devices for masking workpieces during parylene coating processes have been used in the past. One such device is disclosed in U.S. Pat. No. 3,895,135. This patent discloses a technique in which a defined area of each substrate to be coated is individually masked. This technique would be time consuming when a plurality of workpieces are to be coated in a single operation.

Another practice involves the use of two metal plates having a foam facing with a plurality of holes through the plates. The workpieces to be coated were sandwiched between the plates and the assembly held together by clips. Foam spacers were sometimes provided between the plates near their edges. In use, the workpieces were aligned with the holes in the plates and were coated by introducing the vaporous parylene through the holes.

An object of the present invention is to provide an improved fixture which will hold and mask a plurality of workpieces so that they can be simultaneously coated with coating materials such as parylene.

Another object of the present invention is to provide a coating fixture that can be utilized in a batch coater.

DISCLOSURE OF THE INVENTION

The invention provides a new and improved coating fixture especially adapted for use in a parylene batch coating process wherein vapor phase para-xylylene is condensed on articles to form a protective, thermoplastic film. The new coating fixture is designed to hold a large number of workpiece articles and to facilitate loading and unloading of the articles, thereby reducing handling time. Another feature of the invention is a design that permits selective coating of only portions of the workpieces and prevents adherence of the plastic film to other portions.

The coating fixture of the invention comprises a rigid frame, face plates that cooperate with the frame to form an enclosure, at least one such plate having holes through which the coating vapor is introduced into the enclosure, gasket structure on the inside face of the one face plate for sealingly engaging and masking the workpieces, and means securing the face plates to the frame with the workpieces aligned with the face plate holes.

In preferred embodiments, a separator plate divides the enclosure into two article-receiving compartments, and each face plate has holes through which the coating vapor is admitted to the compartments.

In order to facilitate loading of the fixture, the separator plate carries locator structure shaped to embrace the workpiece articles and align them with the face plate holes. The workpiece articles can be quickly arranged against the separator plate and the face plates fastened together against the frame to complete a loaded fixture.

Another feature of the invention is the provision of face plate gaskets that sealingly engage the workpiece articles so that the coating vapor is deposited on only selected portions of the articles. The areas of the gaskets that engage the workpieces may be etched to prevent the coating from adhering to the engaged areas of the workpieces.

Other features and advantages and a fuller understanding of the invention will be had from the following detailed description and the accompanying drawing.

BRIEF DESCRIPTION OF THE DRAWINGS

FIG. 1 is a top plan view of the present invention with a portion of the upper plate cut away;

FIG. 2 is an enlarged, vertical cross sectional view taken along lines 2—2 of FIG. 1;

FIG. 3 is an enlarged exploded view of one encircled portion of FIG. 2; and

FIG. 4 is an enlarged view of another encircled portion in FIG. 2.

BEST MODE FOR CARRYING OUT THE INVENTION

As shown in the accompanying drawings, the coating fixture 10 comprises a rigid frame 12, a face plate 14 and a face plate 16, all of which may be made of aluminum or the like. The face plates 14 and 16 cooperate with rigid frame 12 to form an enclosure 17. Blind standoffs 18 and screws 20 are provided in order to secure the face plates 14, 16 to the frame 12. As shown in FIG. 2, each standoff 18 is fixedly attached to the face plate 16 and the cooperating screw 20 is threaded into the blind standoff 18 through a hole 22 in the face plate 14.

The plate 14 has a plurality of holes 24 and the plate 16 has a plurality of holes 26 which permit fluid communication to the enclosure 17 formed by the face plates and the frame 12. As shown, a plurality of workpieces 28 are placed within the enclosure 17 in alignment with the holes 26 in the face plate 16. A separator plate 30 is then placed on the workpieces 28, and a second layer of workpieces 32 are arranged on the separator plate 30 in alignment with the holes 24 in the face plate 14. Locator members 34a, 34b are provided to facilitate alignment of the workpieces 28, 32 with holes 26, 24, respectively. The locator members 34a, 34b are preferably made of neoprene or the like and fixedly attached in sheet form to each side of support plate 30 by means of an adhesive. As can be seen in FIG. 3, the locator 34a has openings 37 which are shaped to embrace the workpieces 32 and align them with the holes 24. The locator 34b is similarly formed with openings 37 that align the workpieces 28 with the holes 26. The locator sheets 34a, 34b may be attached to the separator plate 30 by double-sided adhesive tape 36, 36' on either side of a diaphragm 38.

Sealing gaskets 40 are provided between the face plates 14, 16 and the frame 12. As can be seen in FIG. 4, it is preferably that the gaskets 40 be fixedly attached to each face plate by use of an adhesive such as double-sided adhesive tape 42. The gaskets have openings corresponding with the holes 24, 26 in the face plates to permit fluid communication through the holes. The diaphragms 38 provide cushions for the workpieces to assure a fluid-tight seal between the workpieces and the plates 14, 16 when the plates are fastened to the frame 12. The diaphragms 38 and the gaskets 40 are preferably made from neoprene and cotton material.

One type of workpiece contemplated to be coated comprises a circuit generally designated by reference numeral 44 contained within a case 45 having an opening 46. The openings 46 of the cases 45 are surrounded by lips 48 that engage the plate gaskets 40. Several of the cases 45 may be connected by metal strips 50.

In use, a plurality of substrate cases 45 or workpieces are arranged on both sides of the separator plate 30 in the manner described above so that the holes 24, 26 of the face plates align with the openings 46 of the workpieces and the face plates 14, 16 are releasably attached to the frame 16 to form the enclosure 17. The gaskets 40 form seals between the frame 16 and the face plates 12, 14 and between the face plates and the lips 48 of the workpieces within the enclosure. The assembled coating fixture 10 is then placed in a deposition chamber, not shown, of a parylene batch coater. The vaporous coating material enters the fixture through the holes 24, 26 in each of the face plates and proceeds only to the interior of the substrate cases 45, since the face plates are sealably engaged with the lip 48 of the substrate cases. No coating material will come in contact with the exterior surfaces of the cases. The coating material is thus deposited on the circuits 44 in the cases 46.

In the preferred embodiment of the present invention, the faces of the gaskets 40 that are exposed in the enclosure 17 are etched inside the areas of engagement with the lips 48 of the cases 45. Parylene material inside the areas bounded by the lips 48 adheres to the etched gasket portions rather than to the lips. This avoids the necessity of trimming such parylene material from the inner surfaces of the lips 48 when the cases 45 are removed from the fixture 10.

The invention has been described with reference to an arrangement in which two layers of workpieces are coated through holes in adjacent face plates. The present invention also contemplates an arrangement in which a single layer of workpieces is loaded in the fixture 10 and is coated only through holes in one of the face plates. In such a device, the other face plate will be solid and will function only as a support plate. The locator member will be fixedly attached to the solid face plate.

Other modifications and variations of the invention will be apparent to those skilled in the art in view of the foregoing detailed disclosure. Therefore, it is to be understood that, within the scope of the appended claims, the invention can be practiced otherwise than as specifically shown and described.

I claim:

1. A coating fixture for holding workpieces during coating by vapor deposition comprising:
   a rigid frame;
   spaced apart face plates cooperable with said rigid frame to form a vapor coating deposition enclosure for holding a plurality of workpieces, said frame being between said face plates;
   at least one of said face plates having a plurality of holes through which a coating vapor can be admitted to coat said workpieces; and,
   gasket means on the inside face of said at least one face plate for sealingly engaging said workpieces, said gasket means having a plurality of openings correspondingly aligned with said plurality of holes to permit said vapor to pass to each workpiece separately.

2. The coating fixture of claim 1 further comprising a separator plate to permit two layers of workpieces to be arranged within said enclosure on each side of said separator plate, each layer of workpieces being coated through holes in the adjacent face plate.

3. The coating fixture of claim 1 or 2 further comprising locator means within said enclosure to receive and align said workpieces with said holes.

4. The coating fixture of claim 2 further comprising locator means on each side of said separator plate to receive and align the workpieces with the holes in said adjacent face plates.

5. The coating fixture of claim 1 wherein said gasket means is etched adjacent the locations inside of where it sealingly engages said workpieces.

6. A coating fixture comprising:
   a rigid frame;
   face plates cooperable with said rigid frame to form an enclosure, each of said face plates having a plurality of holes through which a coating vapor can be admitted to said enclosure;
   separator plate means located within said enclosure to divide it into two workpiece-receiving compartments;
   gasket means on the inside face of each face plate and on each side of said separator plate means for sealingly engaging workpieces to permit coating of only a portion of said workpieces; and
   means for securing said face plates to said frame with the workpieces in said compartments aligned with said holes.

7. The coating fixture of claim 6 further comprising locator means to align said workpieces in each layer with the holes in the adjacent face plate.

8. The coating fixture of claim 7 wherein said locator means comprises sheet-like members on each side of said separator plate means, said members having openings shaped to embrace workpieces.

9. A coating fixture comprising:
   a rigid frame
   face plates cooperable with said rigid frame to form an enclosure for holding a plurality of workpieces;
   at least one of said face plates having a plurality of holes through which a coating vapor can be admitted to coat said workpieces;
   gasket means on the inside face of said at least one face plate for sealingly engaging said workpieces to permit coating of only a portion of said workpieces;
   means for securing said face plates to said frame with said workpieces aligned with said holes; and
   a separator plate to permit two layers of workpieces to be arranged within said enclosure on each side of said separator plate, each layer of workpieces being coated through holes in the adjacent face plate.

10. A coating fixture comprising:
    a rigid frame;
    face plates cooperable with said rigid frame to form an enclosure for holding a plurality of workpieces;
    at least one of said face plates having a plurality of holes through which a coating vapor can be admitted to coat said workpieces;
    gasket means on the inside face of said at least one face plate for sealingly engaging said workpieces to permit coating of only selected portions of said workpieces;
    means for securing said face plates to said frame with said workpieces aligned with said holes;
    a separator plate to permit two layers of workpieces to be arranged within said enclosure one on each side of said separator plate, each layer of workpieces being coated through holes in the adjacent face plate; and,
    locator means on each side of said separator plate to receive and align the workpieces with holes in said adjacent face plates.

* * * * *